United States Patent
Andrys et al.

(10) Patent No.: US 11,316,487 B2
(45) Date of Patent: Apr. 26, 2022

(54) POWER SPLITTER WITH SIGNAL AMPLIFICATION

(71) Applicant: SKYWORKS SOLUTIONS, INC., Irvine, CA (US)

(72) Inventors: Paul Raymond Andrys, Swisher, IA (US); David Steven Ripley, Marion, IA (US)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 0 days.

(21) Appl. No.: 17/020,243

(22) Filed: Sep. 14, 2020

(65) Prior Publication Data

US 2021/0111679 A1 Apr. 15, 2021

Related U.S. Application Data

(60) Division of application No. 16/221,486, filed on Dec. 15, 2018, now Pat. No. 10,778,161, which is a continuation of application No. 15/042,334, filed on Feb. 12, 2016, now Pat. No. 10,187,023.

(60) Provisional application No. 62/116,494, filed on Feb. 15, 2015.

(51) Int. Cl.
| | |
|---|---|
| *H04B 1/04* | (2006.01) |
| *H03F 3/24* | (2006.01) |
| *H03F 3/21* | (2006.01) |
| *H03F 1/02* | (2006.01) |
| *H03F 1/22* | (2006.01) |
| *H03F 3/191* | (2006.01) |
| *H03F 3/72* | (2006.01) |

(52) U.S. Cl.
CPC ........... *H03F 3/245* (2013.01); *H03F 1/0261* (2013.01); *H03F 1/0288* (2013.01); *H03F 1/22* (2013.01); *H03F 3/191* (2013.01); *H03F 3/211* (2013.01); *H03F 3/72* (2013.01); *H03F 2200/111* (2013.01); *H03F 2200/312* (2013.01); *H03F 2200/451* (2013.01); *H03F 2203/21103* (2013.01); *H03F 2203/21127* (2013.01); *H03F 2203/21139* (2013.01); *H03F 2203/7209* (2013.01)

(58) Field of Classification Search
CPC ...... H03F 3/245; H03F 1/0261; H03F 1/0288; H03F 1/22; H03F 3/191; H03F 3/72; H03F 3/211; H03F 2200/111; H03F 2203/7209; H03F 2203/21103; H03F 2203/21127; H03F 2203/21139; H03F 2200/312; H03F 2200/451; H04B 1/04; H04B 1/16; H04B 1/40
See application file for complete search history.

(56) References Cited

U.S. PATENT DOCUMENTS

| | | | | |
|---|---|---|---|---|
| 10,187,023 | B2 * | 1/2019 | Andrys | H03F 3/191 |
| 10,778,161 | B2 * | 9/2020 | Andrys | H03F 3/245 |
| 2016/0241195 | A1 * | 8/2016 | Lehtola | H03F 1/22 |

* cited by examiner

*Primary Examiner* — Andrew Wendell
(74) *Attorney, Agent, or Firm* — Chang & Hale LLP

(57) ABSTRACT

A power splitter that amplifies an input radio-frequency (RF) signal. The power splitter uses a single transistor in a common emitter stage of a cascode amplifier and two or more common base stages of the cascode amplifier to amplify and to split the input RF signal. A common base biasing signal can be used to simultaneously enable two or more of the common base stages to generate two or more amplified RF output signals.

9 Claims, 9 Drawing Sheets

POWER SPLITTER WITH SIGNAL AMPLIFICATION

CROSS-REFERENCE TO RELATED APPLICATION(S)

This application is a division of U.S. application Ser. No. 16/221,486 filed Dec. 15, 2018, entitled POWER SPLITTER WITH CASCODE STAGE SELECTION, which is a continuation of U.S. application Ser. No. 15/042,334 filed Feb. 12, 2016, entitled POWER AMPLIFIER WITH CASCODE SWITCHING OR SPLITTING FUNCTIONALITY (now U.S. Pat. No. 10,187,023 issued Jan. 22, 2019), which claims priority to U.S. Provisional Application No. 62/116,494 filed Feb. 15, 2015, entitled MULTIBAND POWER AMPLIFIER WITH CASCODE SWITCHING, the disclosure of each of which is hereby expressly incorporated by reference herein in its entirety for all purposes.

BACKGROUND

Field

The present disclosure generally relates to power amplifiers.

Description of the Related Art

Some multiband power amplification systems use a common RF gain path which is then switched (via a band switch) into one of a number of multiple filter networks or split (via a passive splitter) into a plurality of filter networks to support the various target frequency bands. The band switch is often implemented using SOI (silicon-on-insulator) or PHEMT (psuedomorphic high-electron-mobility transistor) technology which requires an additional semiconductor die to support the function, adding size and cost to the system. The passive splitter is often implemented using passive lumped or distributed components, also adding size and cost to the system. The band switch or passive splitter also introduces loss into the system that degrades efficiency and requires increased current drain in the power amplification system.

SUMMARY

In accordance with some implementations, the present disclosure relates to a power amplification system. The power amplification system includes a first transistor having a base configured to receive an input radio-frequency (RF) signal and having an emitter coupled to a ground potential. The power amplification system includes a plurality of second transistors. Each one of the plurality of second transistors has a respective emitter coupled to a collector of the first transistor and is configured to, when biased at a respective base, output an output RF signal at a respective collector. The power amplification system further includes a biasing circuit configured to bias one or more of the plurality of second transistors based on a control signal.

In some embodiments, the biasing circuit can be further configured to bias the first transistor.

In some embodiments, the biasing circuit can include at least one of a current source or a voltage source configured to provide a biasing signal that is routed to the one or more of the plurality of second transistors. In some embodiments, the biasing circuit can include a common base biasing component configured to route the biasing signal based on the control signal.

In some embodiments, the biasing circuit can include a plurality of current sources or voltage sources configured to provide respective biasing signals to the one or more of the plurality of second transistors. In some embodiments, the biasing circuit can include a plurality of common base biasing components configured to, when enabled, pass the respective biasing signals to the one or more of the plurality of second transistors. In some embodiments, the biasing circuit can include a controller configured to enable one or more of the common base biasing components based on the control signal.

In some embodiments, the power amplification system can further include an input matching component coupled to the base of the first transistor and configured to match the input RF signal. In some embodiments, the power amplification system can further include a plurality of output matching components. Each one of the plurality of output matching components can be coupled to the respective collector of a respective one of the plurality of second transistors. In some embodiments, each one of the plurality of output matching circuits can be configured to filter the output RF signal to a respective frequency band.

In some embodiments, each one of the respective collectors of the plurality of second transistors can be coupled to a supply voltage via a respective inductor. In some embodiments, each one of the respective collectors of the plurality of second transistors can be coupled to an antenna switch. In some embodiments, each one of the respective collectors of the plurality of second transistors can be coupled to the antenna switch without an intervening band switch. In some embodiments, the antenna switch can include a combiner.

In some embodiments, the control signal can be a band select signal (BSS).

In some implementations, the present disclosure relates to a radio-frequency (RF) module including a packaging substrate configured to receive a plurality of components. The RF module includes a power amplification system implemented on the packaging substrate. The power amplification system includes a first transistor having a base configured to receive an input radio-frequency (RF) signal and having an emitter coupled to a ground potential. The power amplification system includes a plurality of second transistors. Each one of the plurality of second transistors has a respective emitter coupled to a collector of the first transistor and is configured to, when biased at a respective base, output an output RF signal at a respective collector. The power amplification system further includes a biasing circuit configured to bias one or more of the plurality of second transistors based on a control signal.

In some embodiments, the RF module can be a front-end module (FEM).

In some embodiments, the biasing circuit can include at least one of a current source or a voltage source configured to provide a biasing signal that is routed to the one or more of the plurality of second transistors.

In some embodiments, the biasing circuit can include a plurality of current sources or current sources configured to provide respective biasing signals to the one or more of the plurality of second transistors.

In some implementations, the present disclosure relates to a wireless device including a transceiver configured to generate an input radio-frequency (RF) signal. The wireless device includes a front-end module (FEM) in communication with the transceiver. The FEM includes a packaging substrate configured to receive a plurality of components. The FEM further includes a power amplification system implemented on the packaging substrate. The power amplification system includes a first transistor having a base configured to receive the input radio-frequency (RF) signal and having an emitter coupled to a ground potential. The power amplification system includes a plurality of second transistors. Each one of the plurality of second transistors has a respective emitter coupled to a collector of the first transistor and is configured to, when biased at a respective base, output an output RF signal at a respective collector. The power amplification system further includes a biasing circuit configured to bias one or more of the plurality of second transistors based on a control signal. The wireless device further includes an antenna in communication with the FEM. The antenna is configured to transmit the output RF signal.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF SOME EMBODIMENTS

The headings provided herein, if any, are for convenience only and do not necessarily affect the scope or meaning of the claimed invention.

Described herein are circuits, systems, and methods for amplifying an RF signal having one of a plurality of frequency bands. In various implementations, a power amplification system includes a cascode power amplifier as the gain stage and switches multiple common base cascode gain stages to accomplish the multi-band architecture. Such a power amplification system offers advantage of sharing a common RF gain path without adding the loss of a band switch. Band selection is also accomplished without added additional process technology complexity or additional die.

Figure 1:
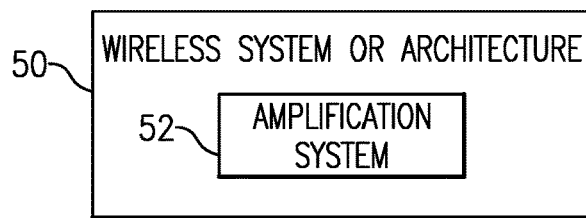
FIG. 1 shows an example wireless system or architecture.

Referring to FIG. 1, one or more features of the present disclosure generally relate to a wireless system or architecture 50 having an amplification system 52. In some embodiments, the amplification system 52 can be implemented as one or more devices, and such device(s) can be utilized in the wireless system/architecture 50. In some embodiments, the wireless system/architecture 50 can be implemented in, for example, a portable wireless device. Examples of such a wireless device are described herein.

Figure 2:
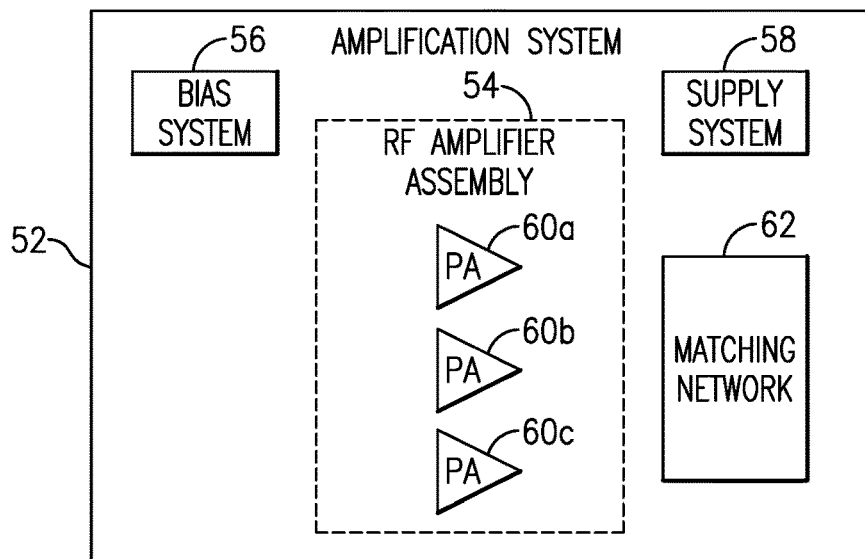
FIG. 2 shows that, in some implementations, an amplification system can include a radio-frequency (RF) amplifier assembly having one or more power amplifiers.

FIG. 2 shows that the amplification system 52 of FIG. 1 typically includes a radio-frequency (RF) amplifier assembly 54 having one or more power amplifiers (PAs). In the example of FIG. 2, three PAs 60a-60c are depicted as forming the RF amplifier assembly 54. It will be understood that other numbers of PA(s) can also be implemented. It will also be understood that one or more features of the present disclosure can also be implemented in RF amplifier assemblies having other types of RF amplifiers.

In some embodiments, the RF amplifier assembly 54 can be implemented on one or more semiconductor die, and such die can be included in a packaged module such as a power amplifier module (PAM) or a front-end module (FEM). Such a packaged module is typically mounted on a circuit board associated with, for example, a portable wireless device.

The PAs (e.g., 60a-60c) in the amplification system 52 are typically biased by a bias system 56. Further, supply voltages for the PAs are typically provided by a supply system 58. In some embodiments, either or both of the bias system 56 and the supply system 58 can be included in the foregoing packaged module having the RF amplifier assembly 54.

In some embodiments, the amplification system 52 can include a matching network 62. Such a matching network can be configured to provide input matching and/or output matching functionalities for the RF amplifier assembly 54.

Figure 3A:
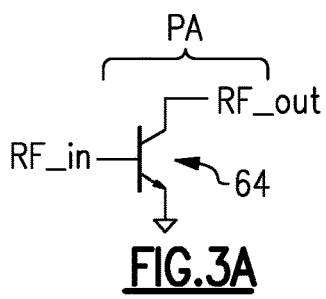
FIGS. 3A-3E show non-limiting examples of power amplifiers.

For the purpose of description, it will be understood that each PA (60) of FIG. 2 can be implemented in a number of ways. FIGS. 3A-3E show non-limiting examples of how such a PA can be configured. FIG. 3A shows an example PA having an amplifying transistor 64, where an input RF signal (RF_in) is provided to a base of the transistor 64, and an amplified RF signal (RF_out) is output through a collector of the transistor 64.

Figure 3B:
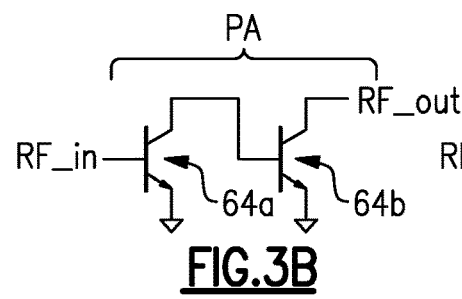

FIG. 3B shows an example PA having a plurality of amplifying transistors (e.g., 64a, 64b) arranged in stages. An input RF signal (RF_in) is provided to a base of the first transistor 64a, and an amplified RF signal from the first transistor 64a is output through its collector. The amplified RF signal from the first transistor 64a is provided to a base of the second transistor 64b, and an amplified RF signal from the second transistor 64b is output through its collector to thereby yield an output RF signal (RF_out) of the PA.

Figure 3C:
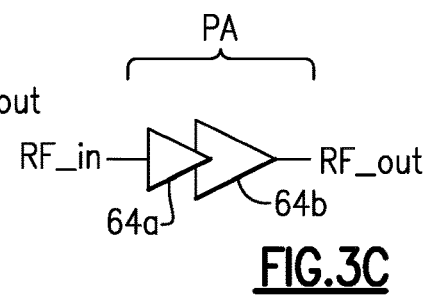

In some embodiments, the foregoing example PA configuration of FIG. 3B can be depicted as two or more stages as shown in FIG. 3C. The first stage 64a can be configured as, for example, a driver stage; and the second stage 64b can be configured as, for example, an output stage.

Figure 3D:
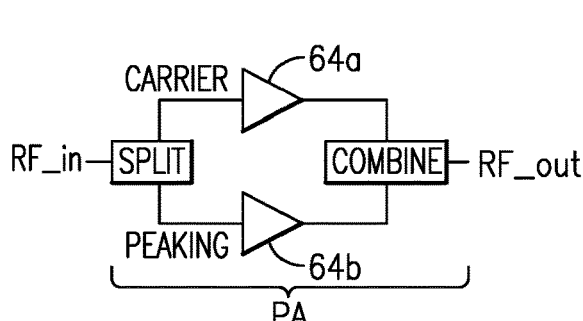

FIG. 3D shows that in some embodiments, a PA can be configured as a Doherty PA. Such a Doherty PA can include amplifying transistors 64a, 64b configured to provide carrier amplification and peaking amplification of an input RF signal (RF_in) to yield an amplified output RF signal (RF_out). The input RF signal can be split into the carrier portion and the peaking portion by a splitter. The amplified carrier and peaking signals can be combined to yield the output RF signal by a combiner.

Figure 3E:
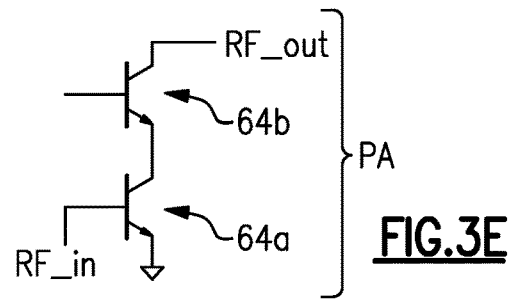

FIG. 3E shows that in some embodiments, a PA can be implemented in a cascode configuration. An input RF signal (RF_in) can be provided to a base of the first amplifying transistor 64a operated as a common emitter device. The output of the first amplifying transistor 64a can be provided through its collector and be provided to an emitter of the second amplifying transistor 64b operated as a common base device. The output of the second amplifying transistor 64b can be provided through its collector so as to yield an amplified output RF signal (RF_out) of the PA.

In the various examples of FIGS. 3A-3E, the amplifying transistors are described as bipolar junction transistors (BJTs) such as heterojunction bipolar transistors (HBTs). It will be understood that one or more features of the present disclosure can also be implemented in or with other types of transistors such as field-effect transistors (FETs).

Figure 4:
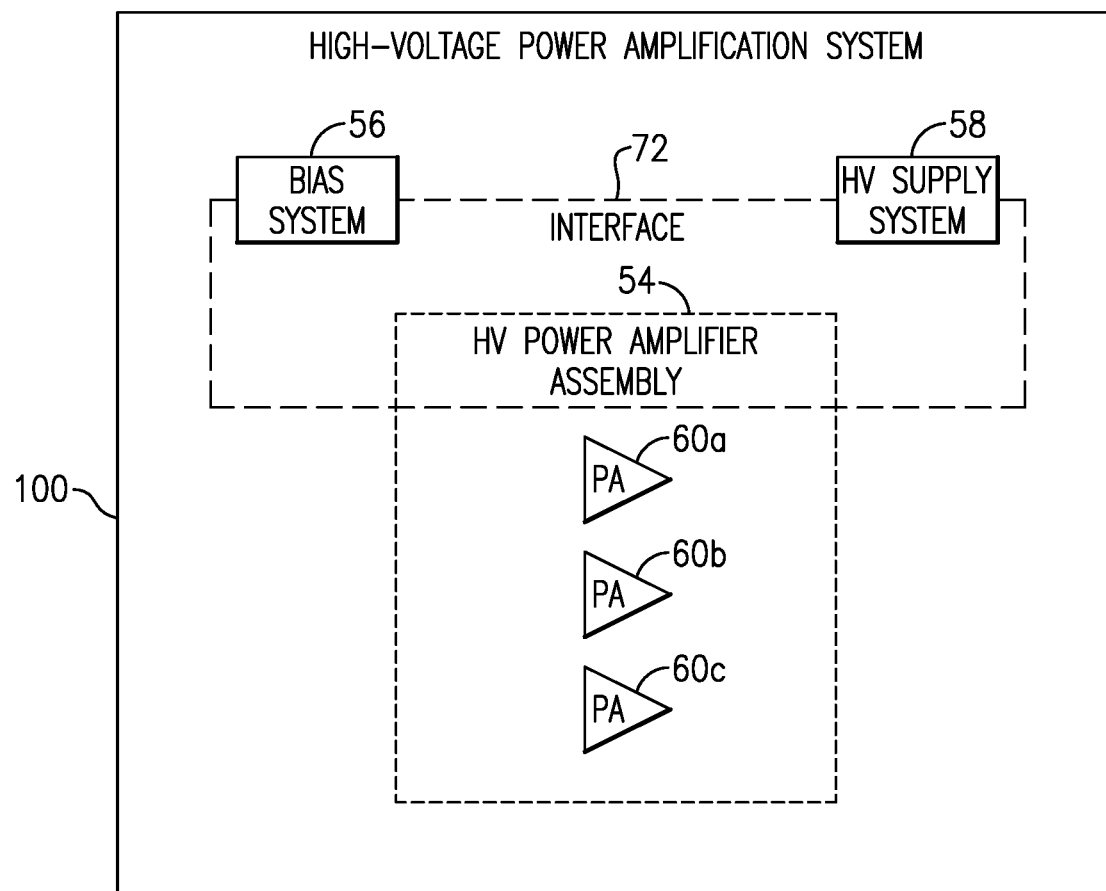
FIG. 4 shows that, in some implementations, an amplification system can be implemented as a high-voltage (HV) power amplification system.

FIG. 4 shows that in some embodiments, the amplification system 52 of FIG. 2 can be implemented as a high-voltage (HV) power amplification system 100. Such a system can include an HV power amplifier assembly 54 configured to include HV amplification operation of some or all of the PAs (e.g., 60a-60c). As described herein, such PAs can be biased by a bias system 56. In some embodiments, the foregoing HV amplification operation can be facilitated by an HV supply system 58. In some embodiments, an interface system 72 can be implemented to provide interface functionalities between the HV power amplifier assembly 54 and either or both of the bias system 56 and the HV supply system 58.

Figure 5:
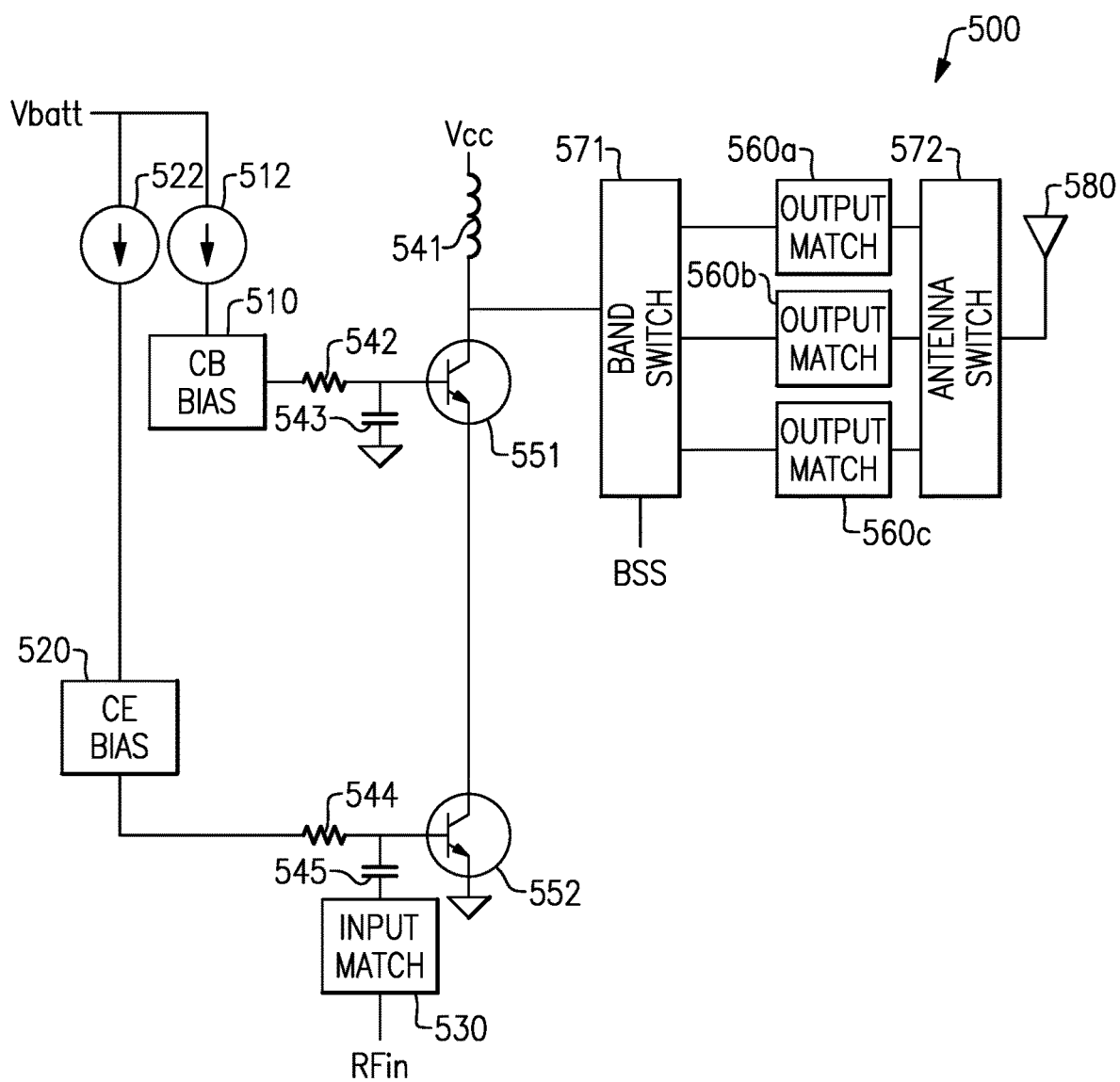
FIG. 5 shows that in some embodiments, a power amplification system can include a band switch.

FIG. 5 shows that in some embodiments, a power amplification system 500 can include a band switch 571. The power amplification system 500 includes cascode power amplifier including a common emitter stage and a common base stage. The common emitter stage includes a first transistor 552 having an emitter coupled to a ground potential. The common base stage includes a second transistor 551 having a base coupled, via a capacitor 543, to the ground potential. The first transistor 552 includes a base coupled, via a capacitor 545 and an input matching component 530, to an RF input for receiving an input RF signal. The first transistor 552 also has a collector coupled to an emitter of the second transistor 551.

The second transistor 551 has a collector coupled, via an inductor 541, to a supply voltage (Vcc). The collector of the second transistor 551 is also coupled, via a band switch 571, one or more output matching components 560a-560c, and an antenna switch 572, to an antenna 580 for transmitting an output RF signal.

The power amplification system 500 includes a biasing circuit for biasing the first transistor 552 and the second transistor 551. The biasing circuit includes a common emitter biasing component 520 that is coupled to the base of the first transistor 552 via an RC decoupling component. The RC decoupling component includes a resistor 544 coupled between the common emitter biasing component 520 and the base of the first transistor 552 and further includes a capacitor 545 coupled between the RF input and the base of the first transistor 552.

The biasing circuit further includes a common base biasing component 510 coupled to the base of the second transistor 551 via an RC decoupling component. The RC decoupling component includes a resistor 542 coupled between the common base biasing component 510 and the base of the second transistor 551 and further includes a capacitor 543 coupled between the ground potential and the base of the second transistor 551.

The common emitter biasing component 520 is configured to, when enabled, receive a current from a current source 522 powered a battery voltage (Vbatt) and provide a biasing signal to the first transistor 552. The biasing signal may be a biasing current (e.g., the current generated by the current source) or a biasing voltage. Similarly, the common base biasing component 510 is configured to, when enabled, receive a current from a current source 512 powered by the battery voltage and provide a biasing signal to the second transistor 551.

The power amplification system 500 is configured to receive an input RF signal via the RF input and provide, as an output RF signal, an amplified version of the input RF signal via the antenna. Typically, the input RF signal is a narrowband signal spanning one of a plurality of frequency bands. Each of the output matching components 560a-560c corresponds to one of the plurality of frequency bands and is configured to provide matching functionality at that frequency band. The output matching components 560a-560c can further include filtering functionality and be configured to filter the signal at the collector of the second transistor to the frequency band.

Thus, a band select signal (BSS) indicating the frequency band of the input RF signal is provided to the band switch 571. In response, the band switch 571 routes the signal from the collector of the second transistor 551 (e.g., the output of the cascode power amplifier) to a corresponding output matching component 560a-560c. The band switch 571 can be, for example, a single-pole/multi-throw (SPMT) switch. The output of the corresponding output matching component is provided to the antenna 580 via the antenna switch 572. The antenna switch 572 can, similarly, be a SPMT switch controlled by the band select signal. Alternatively, the antenna switch 572 can be a combiner that outputs the sum of the inputs.

In various implementations, the band switch 571 is implemented using SOI (silicon-on-insulator) or PHEMT (psuedomorphic high-electron-mobility transistor) technology. This may require an additional semiconductor die to support the function, adding size and cost to the solution. The cascode power amplifier and the band switch 571 may be implemented on a single SOI die. However, this may result in degraded RF performance for the power amplification system 500. A BiHEMT (bipolar-high electron mobility transistor) process may be used that maintains the RF performance of the power amplification system 500, but may increase the cost and complexity of the system. Further, these solutions may introduce loss into the system, such as insertion loss of the switch, degrading efficiency of the system and increasing the current drain on the amplifier.

Described herein is an alternative solution using a cascode power amplifier as the gain stage that switches between multiple common base cascode gain stages to support multiple frequency bands. This solution utilizes a cascode amplifier stage and accomplishes the band selection through switching of the active cascode stage. Given that the cascode section may be present in the amplifier architecture in order to provide high gain and improved ruggedness, the addition of additional parallel cascode stages may not introduce any loss (or any significant loss) into the signal path. Thus, band switching may be accomplished without degrading system efficiency. Selection of the desired band may be accomplished through selective activation of individual bias paths or a single bias path can be present which is directed to activate the bias path of the desired band through band select logic.

Thus, in some implementations as described below, a multi-band power amplifier can include multiple cascode base stages and not include a band switch. Such a solution may offer the advantage of sharing a common RF gain path without adding the loss of a band switch where band selection is also accomplished without additional process technology complexity or additional die, resulting in a highly integrated and low-cost solution.

Figure 6:
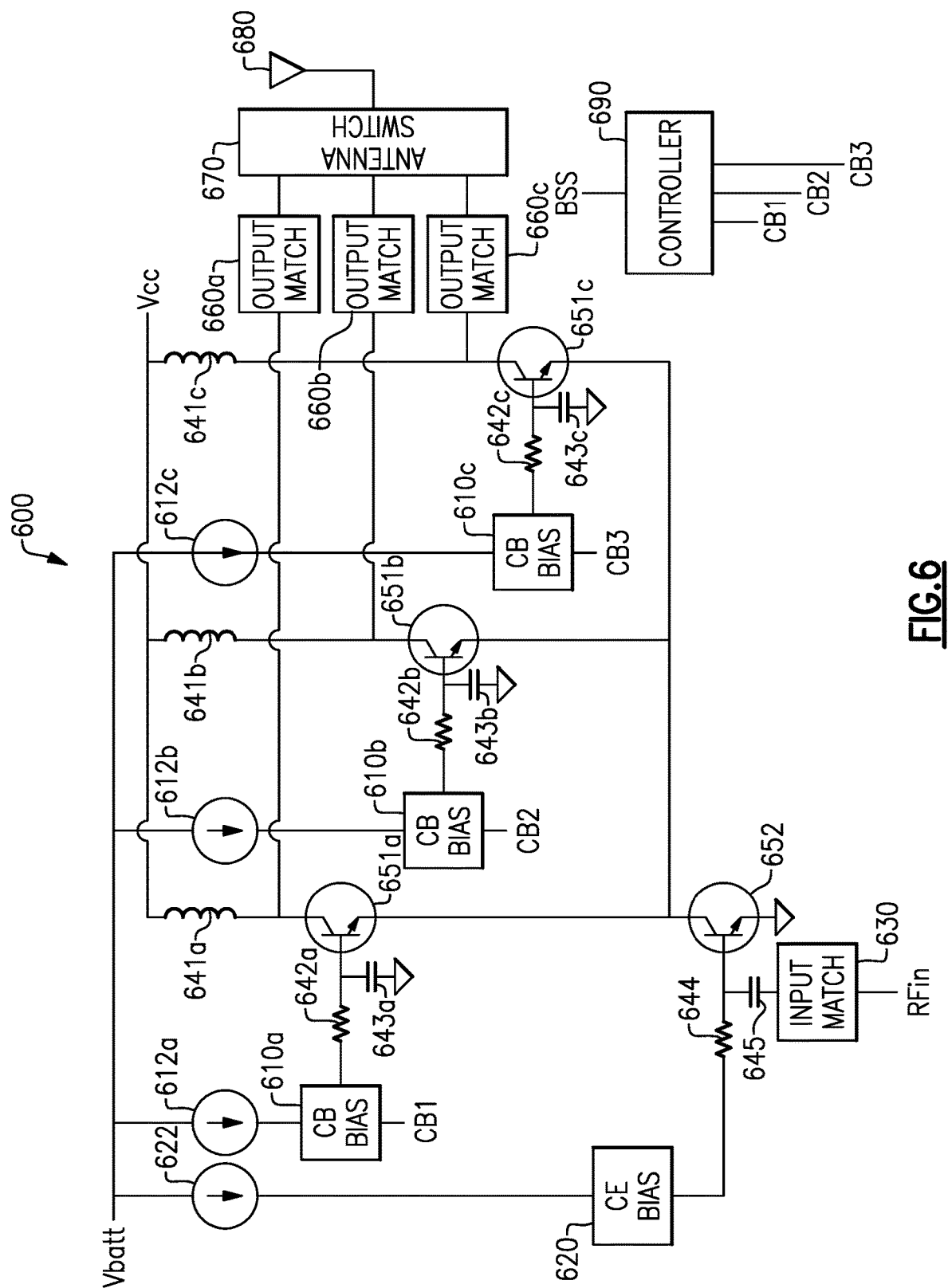
FIG. 6 shows that in some embodiments, a power amplification system can include a cascode configuration with multiple common base cascode stages.

FIG. 6 shows that in some embodiments, a power amplification system 600 can include a cascode configuration with multiple common base cascode stages. The power amplification system 600 includes a cascode power amplifier including a common emitter stage and multiple parallel common base stages. The common emitter stage includes a first transistor 652 having an emitter coupled to a ground potential. Each common base stage includes a second transistor 651a-651c having a base coupled, via a respective capacitor 643a-643c, to the ground potential. The first transistor 652 includes a base coupled, via a capacitor 645 and an input matching component 630, to an RF input for receiving an input RF signal. The first transistor 652 also has a collector coupled to the emitter of each of the second transistors 651a-651c.

Each of the second transistors 651a-651c has a collector coupled, via a respective inductor 641a-641c, to a supply voltage (Vcc). The collector of each of the second transistors 651a-651c is also coupled, via a respective output matching components 660a-660c and an antenna switch 670, to an antenna 680 for transmitting an output RF signal. In particular, the respective collectors of the plurality of second transistors 651a-651c are coupled to the antenna switch 670 without an intervening band switch (e.g., the band switch 571 of FIG. 5).

The power amplification system 600 includes a biasing circuit for biasing the first transistor 652 and one or more of the second transistors 651a-651c. The biasing circuit includes a common emitter biasing component 620 that is coupled to the base of the first transistor 652 via an RC decoupling component. The RC decoupling component includes a resistor 644 coupled between the common emitter biasing component 620 and the base of the first transistor 652 and further includes a capacitor 645 coupled between the RF input and the base of the first transistor 652.

The biasing circuit further includes a plurality of common base biasing components 610a-610c, each one coupled to the base of a respective second transistor 651a-651c via a respective RC decoupling component. Each RC decoupling component includes a resistor 642a-642c coupled between the common base biasing component 610a-610c and the base of the second transistor 651a-651c and further includes a capacitor 643a-643c coupled between the ground potential and the base of the second transistor 651a-651c.

The common emitter biasing component 620 is configured to, when enabled, receive a current from a current source 622 powered a battery voltage (Vbatt) and provide a biasing signal to the first transistor 652. The biasing signal may be a biasing current (e.g., the current generated by the current source 622) or a biasing voltage. Similarly, each of the common base biasing components 610a-610c is configured to, when enabled, receive a current from a respective current source 612a-612c powered by the battery voltage and provide a biasing signal to its respective second transistor 651a-651c. As with the common emitter stage, the biasing signal may be a biasing current (e.g., the current generated by the current source 612a-612c) or a biasing voltage.

The power amplification system 600 is configured to receive an input RF signal via the RF input and provide, as an output RF signal, an amplified version of the input RF signal via the antenna. Typically, the input RF signal spans one of a plurality of frequency bands. Each of the output matching components 660a-660c corresponds to one of the plurality of frequency bands and is configured to provide matching functionality at that frequency band. The output matching components 660a-660c can further include filtering functionality and be configured to filter the signal at the collector of the respective second transistor 651a-651c to the frequency band.

To transmit an RF signal in a particular frequency band, the power amplification system 600 may receive an input RF signal at the RF input (coupled to the input matching component 630). The power amplification system 600 enables the common emitter biasing component 620 (e.g., by activating the current source 622 and/or providing an enable signal to the common emitter biasing component 620) and also enables the common base biasing component 610a-610c for that particular frequency band (e.g., by activating the respective current source 612a-612c and/or providing an enable signal to the common base biasing component 610a-610c for that particular frequency band). The enable signals (CB1, CB2, or CB3) can be provided by a controller 690 in response to a band select signal (BSS) indicating the particular frequency band. In some implementations, the current sources 612a-612c and/or the common emitter biasing components 610a-610c for other frequency bands may be inactive.

The input RF signal may be partially amplified by the common emitter stage resulting in an intermediate RF signal at the collector of the first transistor 652 and the emitters of the second transistors 651a-651c. The intermediate RF signal is further amplified by the common base stage biased by the activated current source 612a-612c and corresponding common base biasing component 610a-610c. The further amplified RF signal is output from the collector of the biased common base cascode stage through a corresponding output matching component 660a-660c that matches and filters the output RF signal to the particular frequency band. The filtered output signal is coupled by the antenna switch 670 to the antenna 680 and transmitted in the particular frequency band.

Figure 7:
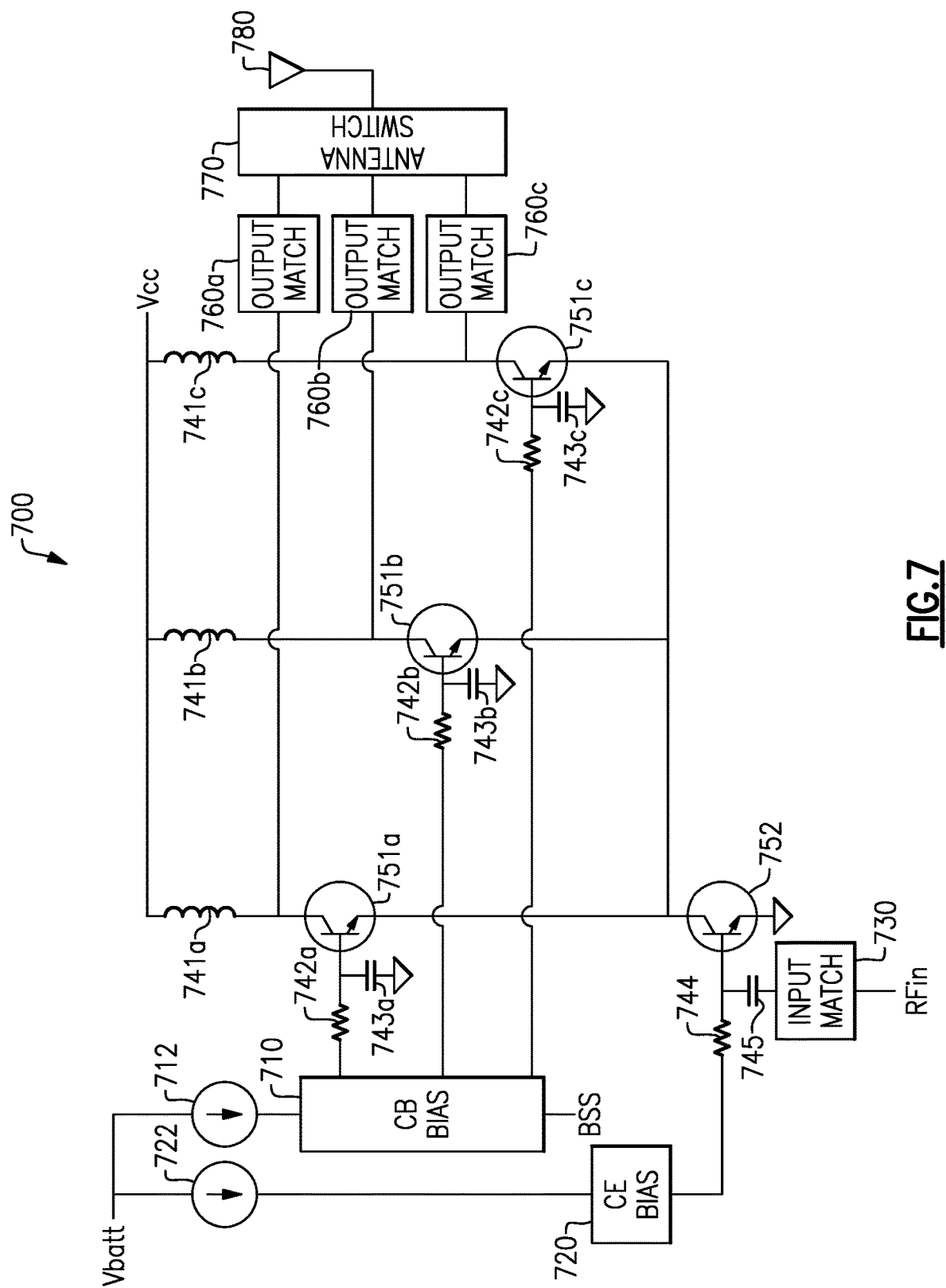
FIG. 7 shows that in some embodiments, a power amplification can include a single common base biasing component with band select logic.

FIG. 7 shows that in some embodiments, the power amplification system 600 of FIG. 6 may be modified by replacing the respective cascode current sources 612a-612c and common base biasing components 610a-610c with a single common base current source 712 and a single common base biasing component 710 with band select logic.

The common base bias component 710 may receive current from the current source 712 and a band select signal (BSS) indicative of a frequency band (or selecting an output to a common base cascode stage corresponding to the frequency band). The signal may be received on a corresponding input for the frequency band of a plurality of inputs (not shown) or may be received on a signal input (as shown), the signal itself indicating which of the outputs is to be biased using the input current. For example, the signal may be one of a plurality of voltage values corresponding to various outputs of the cascode bias component.

Thus, the power amplification system 700 includes a cascode power amplifier including a common emitter stage and multiple parallel common base stages. The common emitter stage includes a first transistor 752 having an emitter coupled to a ground potential. Each common base stage includes a second transistor 751a-751c having a base coupled, via a respective capacitor 743a-743c, to the ground potential. The first transistor 752 includes a base coupled, via a capacitor 745 and an input matching component 730, to an RF input for receiving an input RF signal. The first transistor 752 also has a collector coupled to the emitter of each of the second transistors 751a-751c.

Each of the second transistors 751a-751c has a collector coupled, via a respective inductor 741a-741c, to a supply voltage (Vcc). The collector of each of the second transistors 751a-751c is also coupled, via a respective output matching components 760a-760c and an antenna switch 770, to an antenna 780 for transmitting an output RF signal.

The power amplification system 700 includes a biasing circuit for biasing the first transistor 752 and one or more of the second transistors 751a-751c. The biasing circuit includes a common emitter biasing component 720 that is coupled to the base of the first transistor 752 via an RC decoupling component. The RC decoupling component includes a resistor 744 coupled between the common emitter biasing component 720 and the base of the first transistor 752 and further includes a capacitor 745 coupled between the RF input and the base of the first transistor 752.

The biasing circuit further includes common base biasing components 710 having a plurality of outputs, each one coupled to the base of a respective second transistor 751a-751c via a respective RC decoupling component. Each RC decoupling component includes a resistor 742a-742c coupled between the common base biasing component 710a-710c and the base of the second transistor 751a-751c and further includes a capacitor 743a-743c coupled between the ground potential and the base of the second transistor 751a-751c.

The common emitter biasing component 720 is configured to receive a current from a current source 722 powered a battery voltage (Vbatt) and provide a biasing signal to the first transistor 752. The biasing signal may be a biasing current (e.g., the current generated by the current source 722) or a biasing voltage. Similarly, the common base biasing component 720 is configured to, when enabled, receive a current from a current source 712 powered by the battery voltage and provide a biasing signal to a selected one or more second transistors 751a-751c. As with the common emitter stage, the biasing signal may be a biasing current (e.g., the current generated by the current source 712) or a biasing voltage.

The power amplification system 700 is configured to receive an input RF signal via the RF input and provide, as an output RF signal, an amplified version of the input RF signal via the antenna. Typically, the input RF signal spans one of a plurality of frequency bands. Each of the output matching components 760a-760c corresponds to one of the plurality of frequency bands and is configured to provide matching functionality at that frequency band. The output matching components 760a-760c can further include filtering functionality and be configured to filter the signal at the collector of the respective second transistor 751a-751c to the frequency band.

To transmit an RF signal in a particular frequency band, the power amplification system 700 may receive an input RF signal at the RF input (coupled to the input matching component 730). The power amplification system 700 enables the common emitter biasing component 720 (e.g., by activating the current source 722 and/or providing an enable signal to the common emitter biasing component 720) and also enables the common base biasing component 710 (e.g., by activating the current source 712 and/or providing an enable signal to the common base biasing component 710). The common base biasing component 710 can, in response to a band select signal indicating the particular frequency band, provide a biasing signal via a corresponding output and bias the corresponding second transistor 751a-751c.

Figure 8:
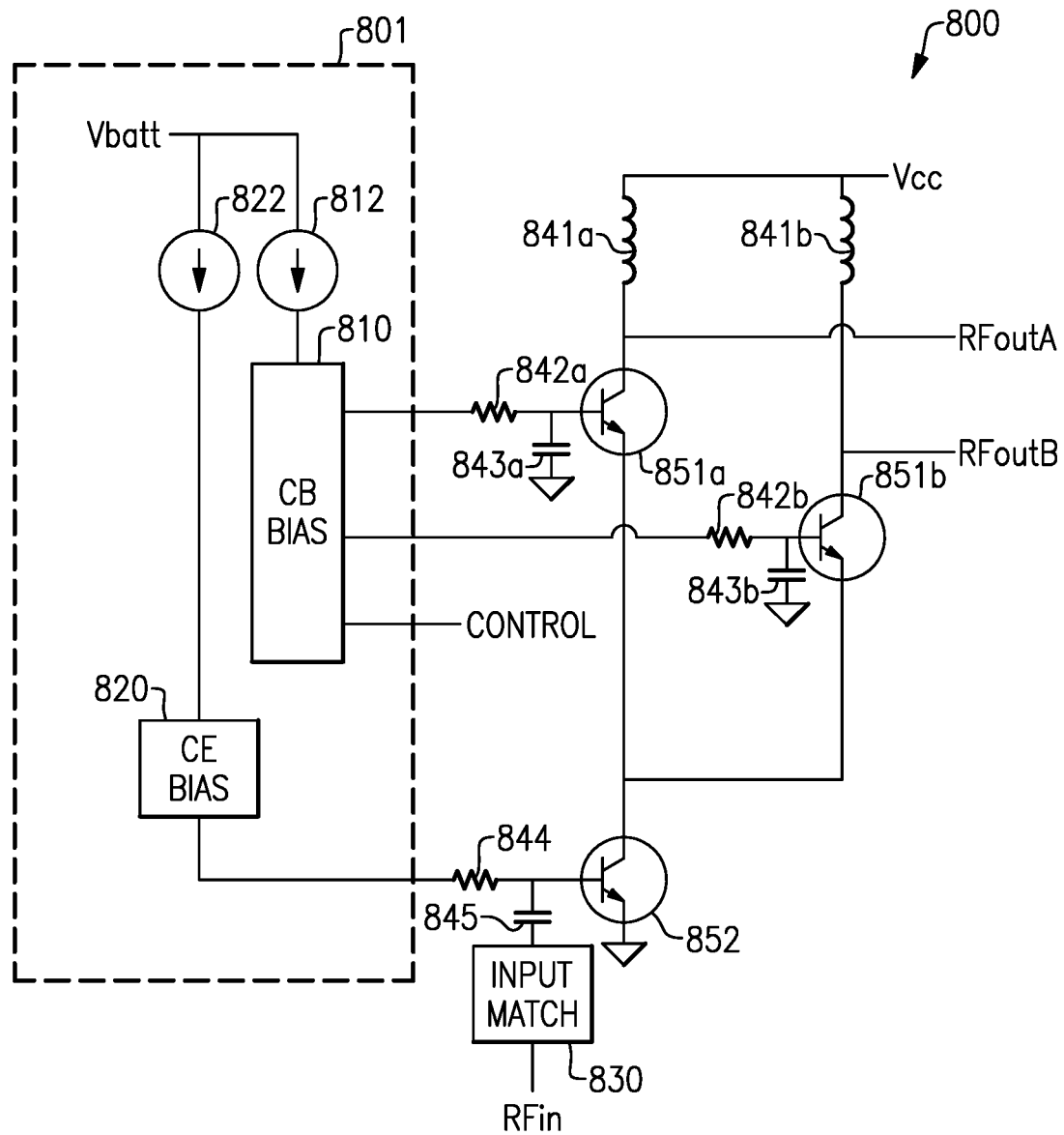
FIG. 8 shows that in some embodiments, a power splitter can include a cascode power amplifier with multiple common base stages.

FIG. 8 shows that in some embodiments, a power splitter 800 can include a cascode power amplifier with multiple common base stages. Whereas FIGS. 5-7 describe a power amplification system for producing an output RF signal as an amplified version of an input RF signal, a similar architecture can be used as a power splitter as shown in FIG. 8. Unlike a typical passive splitter, the power splitter 800 of FIG. 8 introduces signal gain (as a power amplification system) as opposed to a passive splitter which typically introduces signal loss.

The power splitter 800 includes a cascode power amplifier including a common emitter stage and multiple parallel common base stages. The common emitter stage includes a first transistor 852 having an emitter coupled to a ground potential. Each common base stage includes a second transistor 851a-851b having a base coupled, via a respective capacitor 843a-843c, to the ground potential. The first transistor 852 includes a base coupled, via a capacitor 845 and an input matching component 830, to an RF input for receiving an input RF signal. The first transistor 852 also has a collector coupled to the emitter of each of the second transistors 851a-851b.

Each of the second transistors 851a-851b has a collector coupled, via a respective inductor 841a-841b, to a supply voltage (Vcc). The collector of each of the second transistors 851a-851c provides a respective output RF signal.

The power splitter 800 includes a biasing circuit for biasing the first transistor 752 and one or both of the second transistors 851a-851b. The biasing circuit includes a common emitter biasing component 820 that is coupled to the base of the first transistor 852 via an RC decoupling component. The RC decoupling component includes a resistor 844 coupled between the common emitter biasing component 820 and the base of the first transistor 852 and further includes a capacitor 845 coupled between the RF input and the base of the first transistor 852.

The biasing circuit further includes common base biasing components 810 having a plurality of outputs, each one coupled to the base of a respective second transistor 851a-851b via a respective RC decoupling component. Each RC decoupling component includes a resistor 842a-842b coupled between the common base biasing component 810a-810b and the base of the second transistor 851a-851b and further includes a capacitor 843a-843b coupled between the ground potential and the base of the second transistor 851a-851b.

The common emitter biasing component 820 is configured to receive a current from a current source 822 powered a battery voltage (Vbatt) or other voltage and provide a biasing signal to the first transistor 852. The biasing signal may be a biasing current (e.g., the current generated by the current source 812) or a biasing voltage. Similarly, the common base biasing component 820 is configured to receive a current from a current source 812 powered by the battery voltage or other voltage and provide a biasing signal to a selected one or more of the second transistors 851a-851b based on a received control signal. In some embodiments, the control signal is a band select signal (e.g., for implementing a multi-band power amplification system).

When the control signal causes the common base bias component 810 to bias only one of the second transistors 851a-851b, an amplified version of the input RF signal is output at a corresponding output of the power splitter (RFoutA or RFoutB). When the control signal causes the common base bias component 810 to bias both of the second transistors 851a-851b, an amplified version of the input RF signal is split and output at both outputs of the power splitter (RFoutA and RFoutB).

Although FIG. 8 includes two common base stages, it is to be appreciated that some implementations could include three or more stages to split an input RF signal to three or more outputs. In some implementations, with three or more outputs, the power splitter can, according to the control signal, split the input RF signal to more than one, but less than all, of the outputs.

Figure 9:
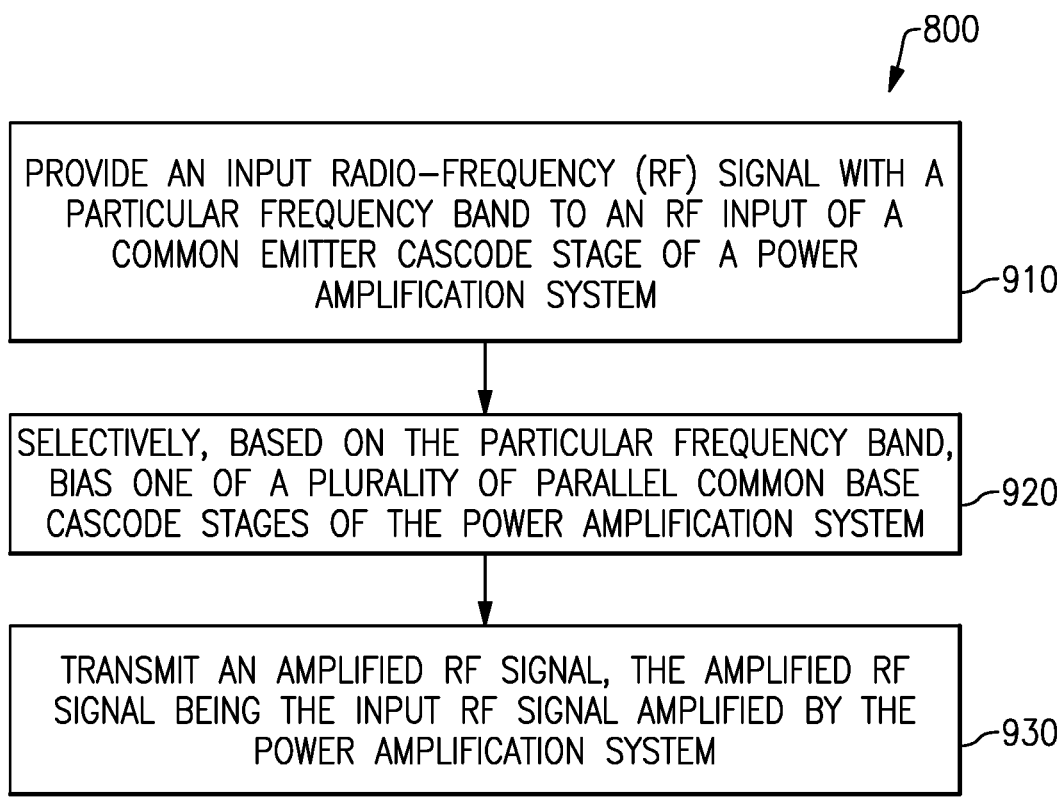
FIG. 9 shows a flowchart representation of a method of amplifying an RF signal.

FIG. 9 shows a flowchart representation of a method of amplifying an RF signal. In some implementations (and as detailed below as an example), the method 900 is at least partially performed by a controller, such as the controller 690 of FIG. 6. In some implementations, the method 900 is at least partially performed by processing logic, including hardware, firmware, software, or a combination thereof. In some implementations, the method 900 is at least partially performed by a processor executing code stored in a non-transitory computer-readable medium (e.g., a memory).

The method 900 begins, at block 910, with the controller providing an input RF signal with a particular frequency band to an RF input of a common emitter cascode stage of a power amplification system.

At block 920, the controller selectively, based on the particular frequency band, biases one (or more) of a plurality of parallel common base cascode stage of the power amplification system. The controller can bias the common base cascode by transmitting a band select signal to a common base biasing component, by enabling a corresponding common base biasing component, by enabling a corresponding current source, or by other methods.

At block 930, the controller transmits an amplified RF signal, the amplified RF signal being the input RF signal amplified by the power amplification system. The controller can, in some implementations, transmit the amplified RF signal by indicating that signal is being transmitted. In some implementations, the controller transmits the amplified RF signal by coupling the amplified RF signal to an antenna. In some implementations, the amplified RF signal is transmitted by the power amplification system without further action by the controller.

Figure 10:
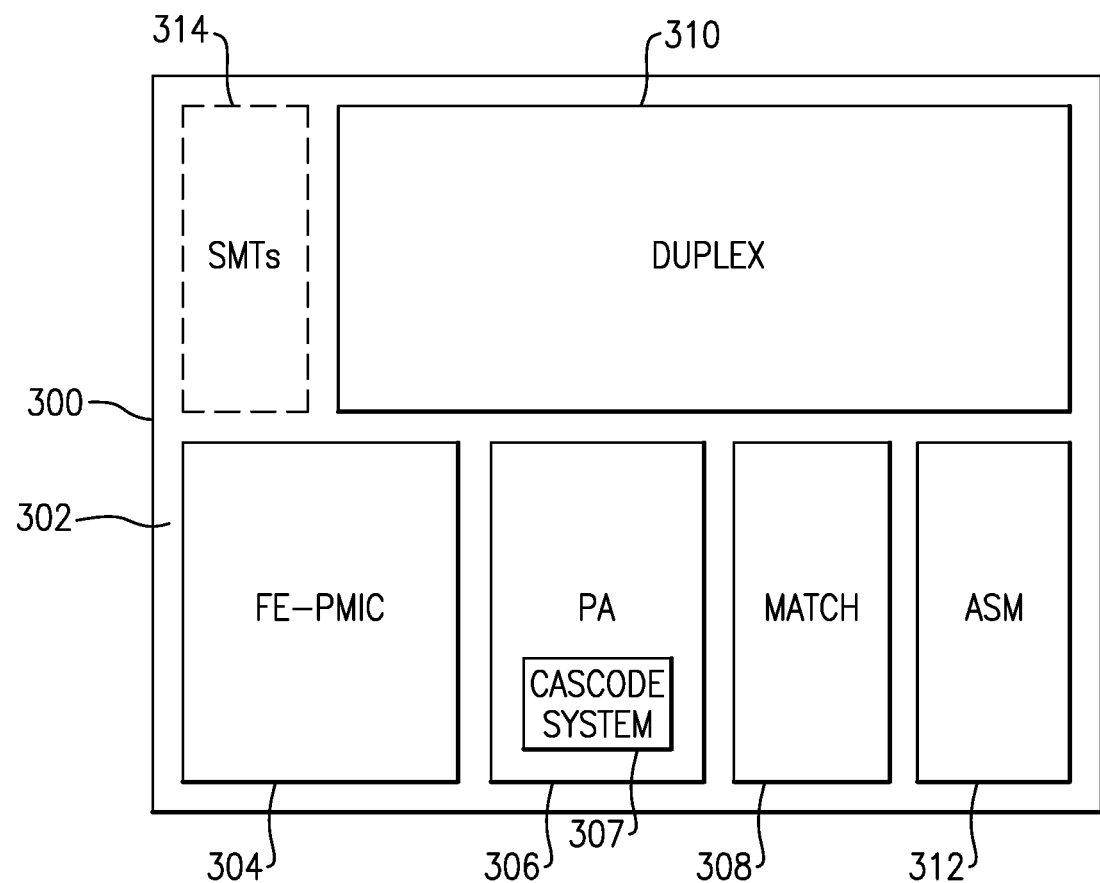
FIG. 10 depicts a module having one or more features as described herein.

FIG. 10 shows that in some embodiments, some or all of power amplification systems (e.g., those shown in FIGS. 5-7) can be implemented, wholly or partially, in a module. Such a module can be, for example, a front-end module (FEM). In the example of FIG. 10, a module 300 can include a packaging substrate 302, and a number of components can be mounted on such a packaging substrate. For example, an FE-PMIC component 304, a power amplifier assembly 306, a match component 308, and a duplexer assembly 310 can be mounted and/or implemented on and/or within the packaging substrate 302. The power amplifier assembly 306 may include a cascode system 307 such as those described above with respect to FIGS. 5-7. Other components such as a number of SMT devices 314 and an antenna switch module (ASM) 312 can also be mounted on the packaging substrate 302. Although all of the various components are depicted as being laid out on the packaging substrate 302, it will be understood that some component(s) can be implemented over other component(s).

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

Figure 11:
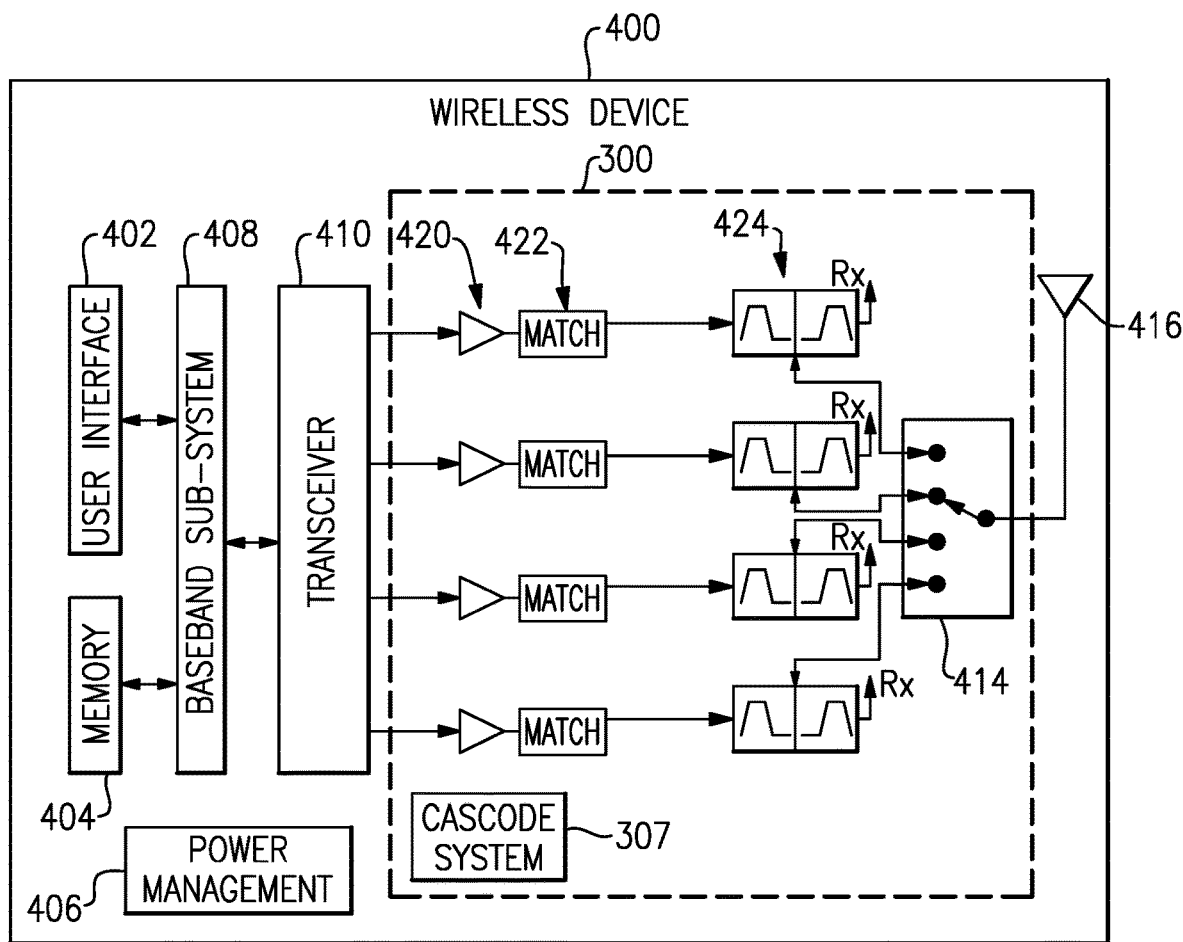
FIG. 11 depicts a wireless device having one or more features described herein.

FIG. 11 depicts an example wireless device 400 having one or more advantageous features described herein. In the context of a module having one or more features as described herein, such a module can be generally depicted by a dashed box 300, and can be implemented as, for example, a front-end module (FEM).

Referring to FIG. 11, power amplifiers (PAs) 420 can receive their respective RF signals from a transceiver 410 that can be configured and operated in known manners to generate RF signals to be amplified and transmitted, and to process received signals. The transceiver 410 is shown to interact with a baseband sub-system 408 that is configured to provide conversion between data and/or voice signals suitable for a user and RF signals suitable for the transceiver 410. The transceiver 410 can also be in communication with a power management component 406 that is configured to manage power for the operation of the wireless device 400. Such power management can also control operations of the baseband sub-system 408 and the module 300.

The baseband sub-system 408 is shown to be connected to a user interface 402 to facilitate various input and output of voice and/or data provided to and received from the user. The baseband sub-system 408 can also be connected to a memory 404 that is configured to store data and/or instructions to facilitate the operation of the wireless device, and/or to provide storage of information for the user.

In the example wireless device 400, outputs of the PAs 420 are shown to be matched (via respective match circuits 422) and routed to their respective duplexers 424. In some embodiments, the power amplifiers 420 and match circuits 422 can be at least part of the matching and filtering components of FIGS. 5 and 6 and/or being included as part of the cascode system 307. Such amplified and filtered signals can be routed to an antenna 416 through an antenna switch 414 for transmission. In some embodiments, the duplexers 424 can allow transmit and receive operations to be performed simultaneously using a common antenna (e.g., 416). In FIG. 8, received signals are shown to be routed to "Rx" paths (not shown) that can include, for example, a low-noise amplifier (LNA).

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

As described herein, one or more features of the present disclosure can provide a number of advantages when implemented in systems such as those involving the wireless device of FIG. 11. For example, the disclosed architecture may replace a PHEMT or SOI band switch with a cascode switching function within the PA core. Such a solution may offer the advantage of sharing a common RF gain path without adding the loss of a band select where band selection is also accomplished without additional process technology complexity or an additional die. Further, replacing a passive splitter with an active splitter replaces signal loss with signal gain.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A method for splitting an input radio-frequency (RF) signal, the method comprising:
   combining the input RF signal with a common emitter biasing signal to bias a first transistor of a common emitter stage of a cascode amplifier configuration;
   generating an intermediate RF signal at a collector of the common emitter stage;
   biasing simultaneously, using a common base biasing signal, three or more of a plurality of parallel second transistors that form a common base stage of the cascode amplifier configuration, each second transistor of the plurality of parallel second transistors having a respective emitter coupled to the collector of the first transistor; and
   amplifying the intermediate RF signal using each of the two or more of the plurality of parallel second transistors to generate two or more amplified RF signals that are output at respective output ports.

2. The method of claim 1 further comprising generating a control signal to indicate which of the plurality of parallel second transistors to simultaneously bias.

3. The method of claim 1 further comprising providing a supply voltage to each collector of the plurality of parallel second transistors.

4. The method of claim 1 further comprising providing a battery voltage to bias the first transistor and to simultaneously bias the two or more of the plurality of parallel second transistors.

5. The method of claim 1 further comprising impedance matching the input RF signal prior to combining the input RF signal with the common emitter biasing signal.

6. A method for splitting an input radio-frequency (RF) signal, the method comprising:
   combining the input RF signal with a common emitter biasing signal to bias a first transistor of a common emitter stage of a cascode amplifier configuration;
   impedance matching the input RF signal prior to combining the input RF signal with the common emitter biasing signal;
   generating an intermediate RF signal at a collector of the common emitter stage;
   biasing simultaneously, using a common base biasing signal, two or more of a plurality of parallel second transistors that form a common base stage of the cascode amplifier configuration, each second transistor of the plurality of parallel second transistors having a respective emitter coupled to the collector of the first transistor; and
   amplifying the intermediate RF signal using each of the two or more of the plurality of parallel second transistors to generate two or more amplified RF signals that are output at respective output ports.

7. The method of claim 1 further comprising generating a control signal to indicate which of the plurality of parallel second transistors to simultaneously bias.

8. The method of claim 1 further comprising providing a supply voltage to each collector of the plurality of parallel second transistors.

9. The method of claim 1 further comprising providing a battery voltage to bias the first transistor and to simultaneously bias the two or more of the plurality of parallel second transistors.

* * * * *